US009640463B2

(12) United States Patent
Lam et al.

(10) Patent No.: US 9,640,463 B2
(45) Date of Patent: *May 2, 2017

(54) BUILT-UP LEAD FRAME PACKAGE AND METHOD OF MAKING THEREOF

(71) Applicant: Nexperia B.V., Eindhoven (NL)

(72) Inventors: Kan Wae Lam, Ta Kwu Ling (HK); Pompeo V. Umali, Ma Wan (HK); Chi Ho Leung, Kwun Tong (HK); Shun Tik Yeung, Hong Kong (HK); Chi Ling Shum, Hong Kong (HK)

(73) Assignee: Nexperia B.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/746,612

(22) Filed: Jun. 22, 2015

(65) Prior Publication Data
US 2016/0372403 A1 Dec. 22, 2016

(51) Int. Cl.
H01L 21/44 (2006.01)
H01L 23/495 (2006.01)
H01L 21/56 (2006.01)
H01L 21/48 (2006.01)
H01L 21/78 (2006.01)
(Continued)

(52) U.S. Cl.
CPC .... *H01L 23/49503* (2013.01); *H01L 21/4825* (2013.01); *H01L 21/4842* (2013.01); *H01L 21/565* (2013.01); *H01L 21/78* (2013.01); *H01L 23/3107* (2013.01); *H01L 23/49541* (2013.01); *H01L 23/49575* (2013.01); *H01L 25/50* (2013.01)

(58) Field of Classification Search
CPC ......... H01L 23/49503; H01L 23/49541; H01L 23/3107; H01L 23/49575; H01L 2924/0002; H01L 2924/00; H01L 2924/01029; H01L 2924/01078; H01L 2224/48247; H01L 2224/48091; H01L 2224/48147
USPC ................................. 438/123, 124, 106, 121
See application file for complete search history.

(56) References Cited

U.S. PATENT DOCUMENTS 8,017,447 B1 * 9/2011 Olsen .................. H01L 21/4821
257/E23.037
8,049,324 B1 11/2011 Zeta
(Continued)

FOREIGN PATENT DOCUMENTS

WO 2012/040873 A1 4/2012

*Primary Examiner* — (Vikki) Hoa B Trinh
(74) *Attorney, Agent, or Firm* — Ohlandt, Greeley, Ruggiero & Perle, LLP.

(57) ABSTRACT

Consistent with an example embodiment, a semiconductor device comprises a device die having bond pads providing connection to device die circuitry. The semiconductor device includes a built-up substrate lead frame having, a substructure of I/O terminals and a die attach area, the I/O terminals and die attach area enveloped in a molding compound, the die attach area having exposed areas to facilitate device die attachment thereon and the terminal I/O terminals providing connection to the device die bond pads; connection traces electrically couple the I/O terminals with one another, said connection traces having facilitated electroplating of exposed vertical surfaces of the I/O terminals during assembly, said connection traces being severed after assembly. An envelope of molding compound encapsulates the device die onto the built-up substrate lead frame.

7 Claims, 7 Drawing Sheets

(51) Int. Cl.
    *H01L 23/31*         (2006.01)
    *H01L 25/00*         (2006.01)

(56) References Cited

U.S. PATENT DOCUMENTS

| | | |
|---|---|---|
| 8,076,181 B1 | 12/2011 | Pruitt et al. |
| 2007/0152319 A1 | 7/2007 | Takiar et al. |
| 2007/0278701 A1 | 12/2007 | Chang et al. |
| 2008/0303166 A1 | 12/2008 | Liao et al. |
| 2012/0181678 A1 | 7/2012 | Groenhuis et al. |

* cited by examiner

BUILT-UP LEAD FRAME PACKAGE AND METHOD OF MAKING THEREOF

FIELD

This disclosure relates to integrated circuit (IC) packaging. More particularly, this disclosure relates to a leadless packaged semiconductor device and a method of making thereof.

BACKGROUND

The electronics industry continues to rely upon advances in semiconductor technologies to realize higher-function devices in more compact areas. For many applications realizing higher-functioning devices requires integrating a large number of electronic devices into a single silicon wafer. As the number of devices per given area of the silicon wafer increases, the manufacturing process becomes more difficult.

Many varieties of semiconductor devices have been manufactured having various applications in numerous disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, bipolar transistors, BiCMOS transistors. Such MOSFET devices include an insulating material between a conductive gate and silicon-like substrate; therefore, these devices are generally referred to as IGFETs (insulated-gate FET).

Having manufactured a number of electronic devices on a wafer substrate, a particular challenge is to package these devices for their given purpose. As the complexity of portable systems increases, there is a commensurate need to reduce the size, enhance the electrical performance, and enhance the thermal performance of the individual components which make up the system as the device is often laid out on a printed circuit substrate. There is a need for packaging which can address these challenges.

SUMMARY

One significant challenge in the mounting of devices onto a printed circuit board (PCB) is maintaining the integrity of the solder connection between I/O terminals of the device and corresponding landings on the PCB. One bad solder connection (i.e., a "cold joint") may render a complex mobile device useless. Thus, a manufacturer of the mobile device needs a way to efficiently judge the quality of the solder connection. The present disclosure uses a built-up substrate lead frame whose I/O terminals are shorted together with conduction traces, so that during the sawing and singulation process, the vertical faces of the I/O terminals on a given package used, may be exposed and electroplated with a solderable metal such as tin (Sn) or alloys thereof. After the sawing and singulation the short-circuit connections of the I/O terminals are severed. The I/O terminals connect corresponding connections of the encapsulated device die. The I/O terminals are plated on all exposed surfaces. The plated vertical face provides the user a convenient view of the solder quality. If the soldering looks good on the vertical face, likely the underside surface solder interface between the I/O terminal and corresponding PCB landing is all right. There is sufficient electrical conductivity and mechanical strength.

According to an aspect of the present disclosure, there is a method for forming a semiconductor device in a leadless chip carrier (LCC) having a pre-plated and pre-molded lead frame assembly having an array of sub-assemblies each having a device die arranged thereon, the sub-assemblies having I/O terminals electrically connected to the device die, and the I/O terminals mutually connected to one another by connection traces. The method comprises encapsulating, in a molding compound, the device die arranged on the array of sub-assemblies of the pre-plated and pre-molded lead frame assembly; in a first direction in a series of parallel cuts, cutting through the molding compound covering the I/O terminals, to a depth, exposing un-plated vertical surfaces of the I/O terminals; electroplating the I/O terminals to form plated vertical surfaces; and in a second direction in a series of parallel cuts, the second direction angled with respect to the first direction, the second series of cuts extending through the lead frame assembly and molding compound and severing the connection traces, to singulate an individual LCC device from the lead frame assembly.

In an example embodiment, the first direction of the first series of parallel cuts is in the X-direction and the second direction of the second series of parallel cuts is in the Y-direction.

In an example embodiment, the connection traces electrically couple to one another at a common connection track in the Y-direction of the LCC pre-molded lead frame assembly.

In an example embodiment, the connection traces and the common connection track are co-planar with one another and on a surface of the I/O terminals.

In an example embodiment, the device die is in contact with the surface of the I/O terminals.

In another aspect of the present disclosure, there is semiconductor device comprising a device die having bond pads providing connection to device die circuitry; a built-up substrate lead frame. The built-up substrate lead frame has a sub-structure of I/O terminals and a die attach area, the I/O terminals and die attach area are enveloped in a molding compound, the die attach area has exposed areas to facilitate device die attachment thereon and the terminal I/O terminals provide connection to the device die bond pads, connection traces electrically couple the I/O terminals with one another, said connection traces having facilitated electroplating of exposed vertical surfaces of the I/O terminals during assembly, said connection traces being severed after assembly. An envelope of molding compound encapsulates the device die onto the built-up substrate lead frame.

In an example embodiment, the connection traces are co-planar with one another and a surface of the I/O terminals and the die attach area and endpoints of connection traces electrically couple to one another at a common connection track in a first direction of the built-up substrate lead frame.

In an example embodiment, the first direction of the connection track of the built-up substrate lead frame is in the Y-direction.

In an example embodiment, the sub-structure of I/O terminals and die attach area is configured as one of the following: leadless chip carrier (LCC), depopulated very-tin-flat-pack no-leads (DFN), flat-pack no-leads (FN), chip-on-lead (COL).

In another aspect of the present disclosure, there is method for making a built-up lead frame whose I/O terminals can be electroplated on their vertical surfaces, the method comprises selecting a lead frame assembly structure, the lead frame assembly structure having an having an array of sub-assemblies, each sub-assembly having a device position arranged thereon, the device die position having I/O terminals on first side and on an opposite second side; molding the lead frame assembly structure, thereby forming a built-up lead frame assembly structure, wherein the molding and lead frame assembly structure are coplanar with one another; and defining connection traces electrically coupling the I/O terminals of each die position to one another, the connection traces at endpoints converging onto a plurality of common connection tracks, the common connection tracks going in a Y-direction.

In an example embodiment, the defining of the connection traces is done with photo-lithographic techniques and the connection traces are printed on a surface shared by the device die position.

In an example embodiment, the connection traces at endpoints converge onto the plurality of common connection tracks whose direction is perpendicular to the direction of connection traces.

The above summaries of the present invention are not intended to represent each disclosed embodiment, or every aspect, of the present invention. Other aspects and example embodiments are provided in the figures and the detailed description that follow.

BRIEF DESCRIPTION OF THE DRAWINGS

The invention may be more completely understood in consideration of the following detailed description of various embodiments of the invention in connection with the accompanying drawings, in which.

Figure 1:
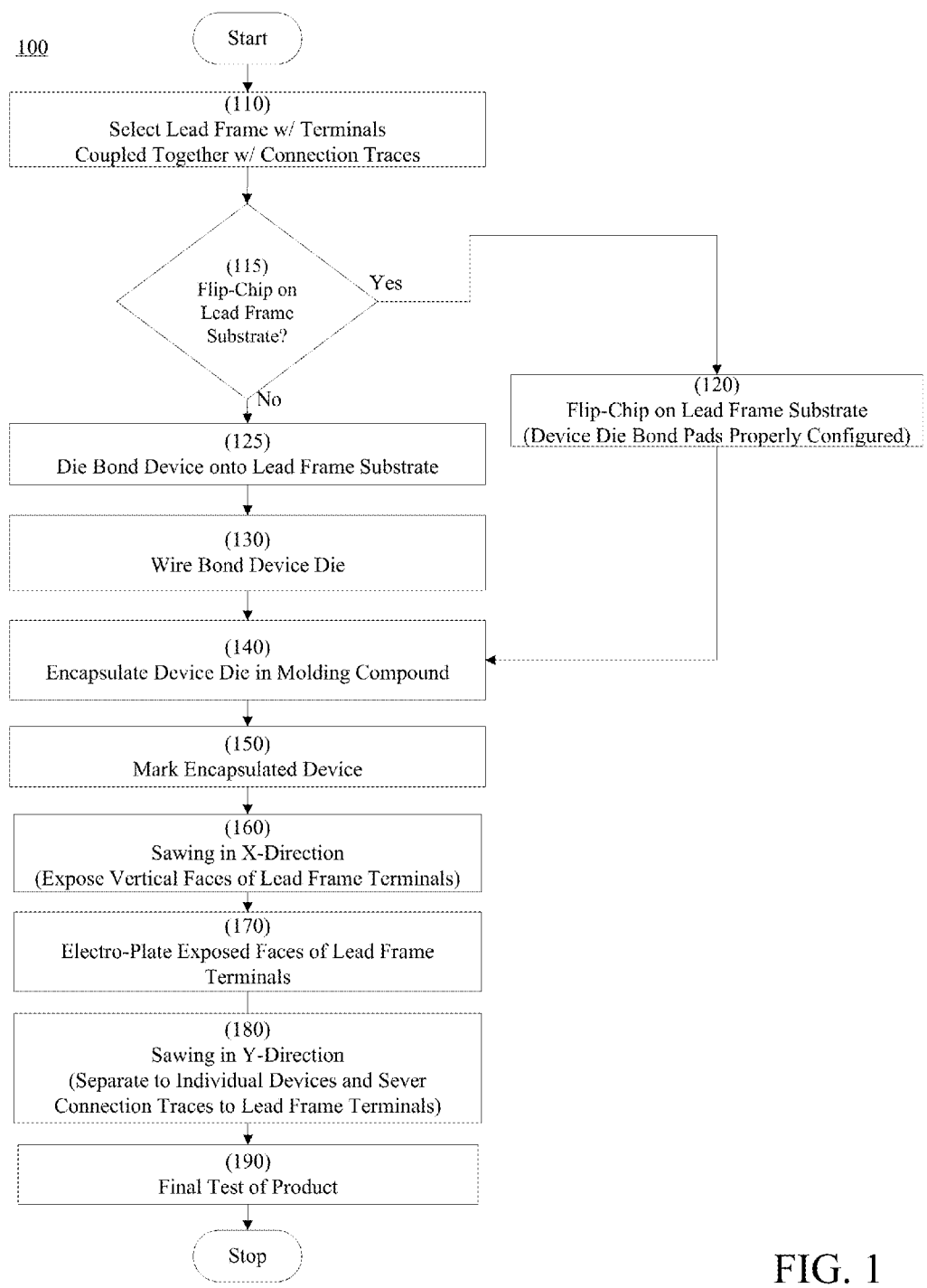
FIG. 1 is a flow diagram of the making of a device according to an embodiment of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present disclosure has been found useful in addressing the challenges packaging semiconductor devices used in portable systems. Leadless packaged semiconductor devices are known to provide advantages over leaded packages. Those advantages include better electrical performance in terms of reduced lead inductance, good heat dissipation by use of an exposed thermal pad to improve heat transfer to a PCB (printed circuit board), reduced package thickness and smaller footprint, which reduces the area occupied on a PCB. Examples of leadless packaged semiconductor devices may include DFN (depopulated very-thin-flat no-lead devices) DFN16 or HXSON16 (thermal enhanced extremely thin small-outline package, no leads), but are not so limited. However, a disadvantage of leadless packaged semiconductor devices is that inspection of solder joints when mounted on a PCB can be difficult. Conventional inspection techniques utilize so-called Automated Optical Inspection (AOI) systems, whereby a camera scans the leadless packaged semiconductor devices mounted on the PCB for a variety of defects such as open circuit connections, short circuit connections, thinning of the solder connections and incorrectly placed devices. Due to the semiconductor device I/O terminals being arranged on the bottom of the device, and therefore hidden from view when the device is mounted a PCB, it is not generally possible to use AOI systems with leadless semiconductor devices. Automatic X-Ray Inspection (AXI) systems may allow inspection of solder joints, however AXI systems are expensive.

A solution allowing solder joints to be inspected by AOI is to include a metal side pads that extend from the device I/O terminals on the bottom of the device at least partially up an external sidewall of the device. Typically the metal side pads may be formed of tin, lead or tin-lead alloys. During soldering processes attaching the device to the PCB, the solder will wet the I/O terminal on the bottom of the device and also the metal side pads. As a result a portion of the solder joint will be visible allowing inspection by AOI techniques. The solder joint may be considered good, provided that the metal side pads are correctly soldered even if the I/O terminal is not correctly soldered to the PCB.

In addition to ease of inspection, metal side pads may reduce tilting of the device when mounted on a PCB. Metal side pads may also improve shearing and bending performance because of the increased soldered area.

Embodiments of the present disclosure are useful in assuring that the I/O terminals can be plated on their vertical side surfaces. A package according to the present disclosure would include a metal sub-assembly, usually of tin-plated copper, with the device contacts encapsulated in a molding compound (i.e., a "built-up" lead frame). On one side upon which device die are attached, the device contacts are flush and planar with the molding compound. On an opposite side, the contacts of the built-up lead frame are also enveloped with molding compound and are also flush and planar with the molding compound; these contacts connect the device to a user's printed circuit board. Depending upon the device die size and complexity, such a sub-assembly is an array of hundreds to perhaps, thousands of devices. To assure that the I/O terminals can be plated on their vertical side surfaces, connection traces, of a geometry substantially thinner than that of the I/O terminals, electrically couple the I/O terminals to one another. Thus, during the sawing and singulation process, the exposed and un-plated vertical faces of I/O terminals are electrically connected to one another and can be electroplated with a solderable surface, such as tin (Sn) or alloys, thereof. Whether horizontal or vertical, all exposed surfaces are plated.

A feature of the present disclosure is that it is possible to add these thin connection traces to an existing lead frame design. The lead frame is built-up in a molding compound. Through lithography and masking steps, connection traces may be added to electrically couple the I/O terminals (i.e, short-circuit them together). After sawing and singulation, the short-circuit connections are severed.

Refer to FIG. 1. In an example process 100, a built-up lead frame is configured according to an embodiment of the present disclosure. In step 110, a lead frame, with an array of device positions, with pins electrically coupled via connection traces is selected. The user may select assembly with either wire bonding or flip-chip, in step 115. In some applications, wire bonding may be suitable. In step, 125 active device die are bonded to the lead frame or substrate. After die bonding, in step 130, the device die are wire bonded to the lead frame. In other applications, flip-chip bonding, step 120, is appropriate. Having completed making the device connections to the package, the lead frame is encapsulated in a molding compound in step 140. After the molding, the devices may be marked at step 150. In step 160, sawing in a first direction ("X" direction) cuts through the soldering pins and exposes vertical side faces of the lead frame terminals of each device die position. The design of the lead frame shorts the terminal together so that in step 170, these exposed terminals may undergo an electroplating of tin (Sn). In step 180, a sawing in a second direction ("Y" direction) separates the array of devices from one another into individual devices and severs the connection traces to the pins. The individual devices undergo a final test in step 190. Electroplating is a process that uses electric current to reduce dissolved positive ions (i.e., cations) of metal from the tin anode, so that they form a coherent metal coating on an electrode, the electrode (i.e, cathode) being the un-plated surfaces of the I/O terminals.

Figure 2A:
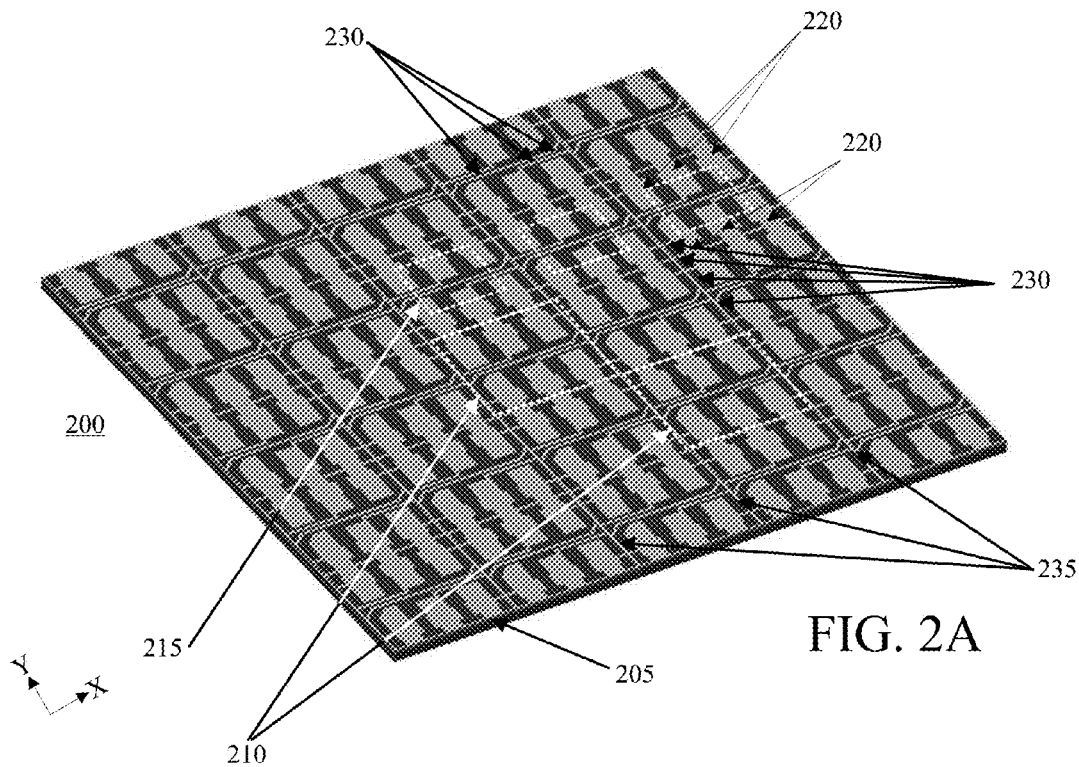
FIGS. 2A-2F are perspective views of an example lead frame that may be used in assembling a device according to an embodiment of the present disclosure.
Figure 2B:
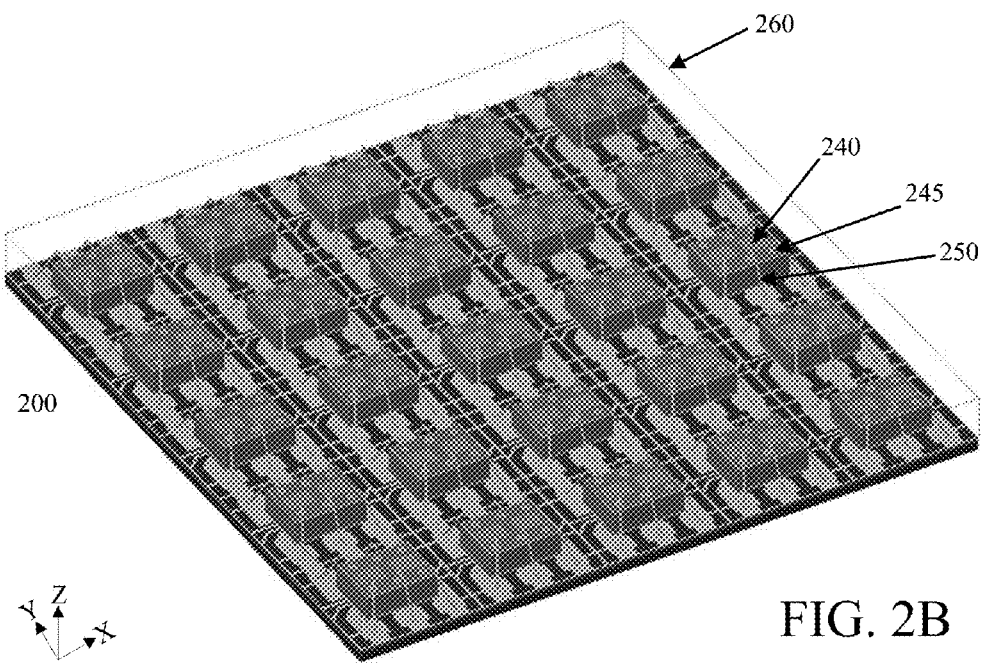
Figure 2C:
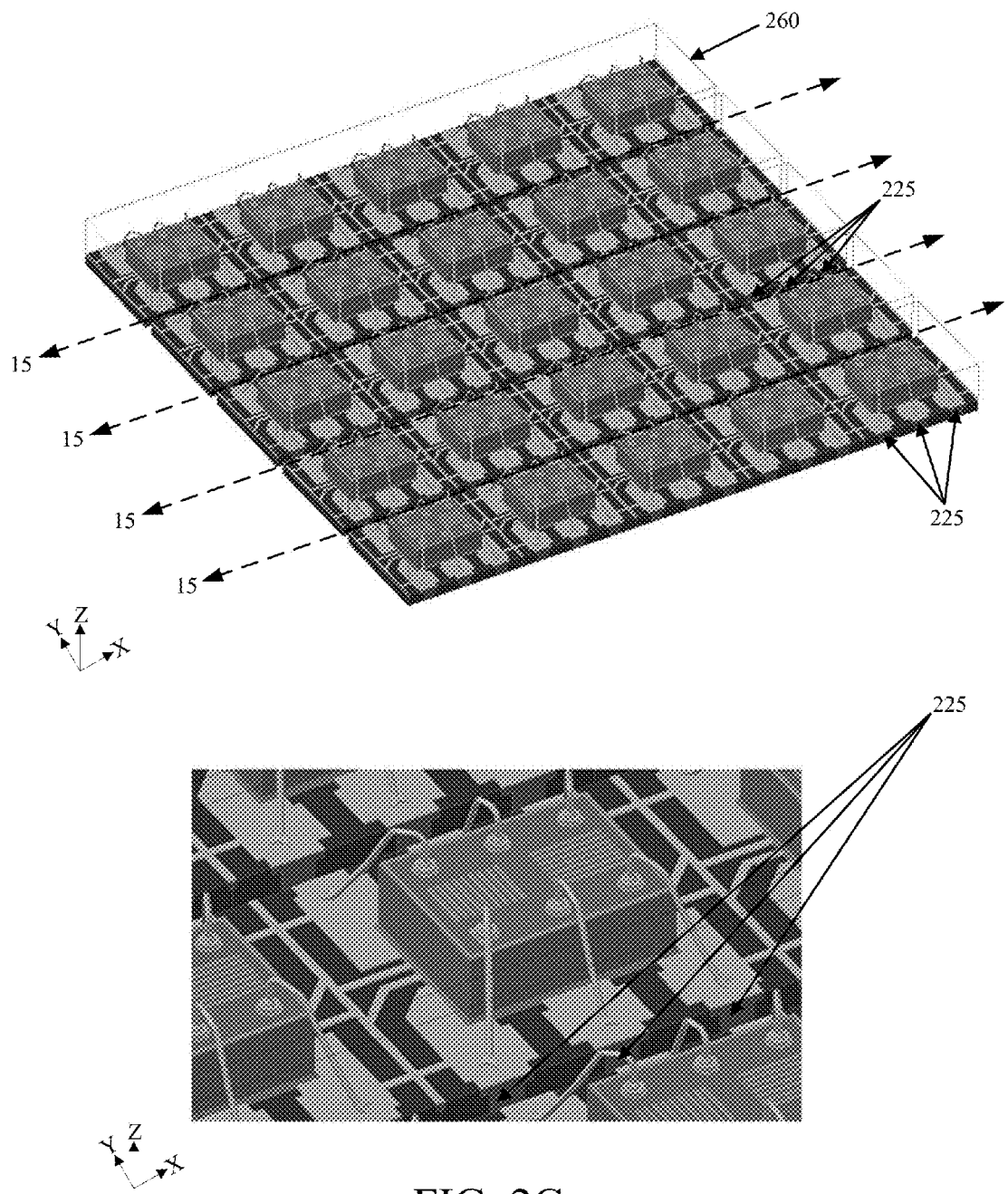
Figure 2D:
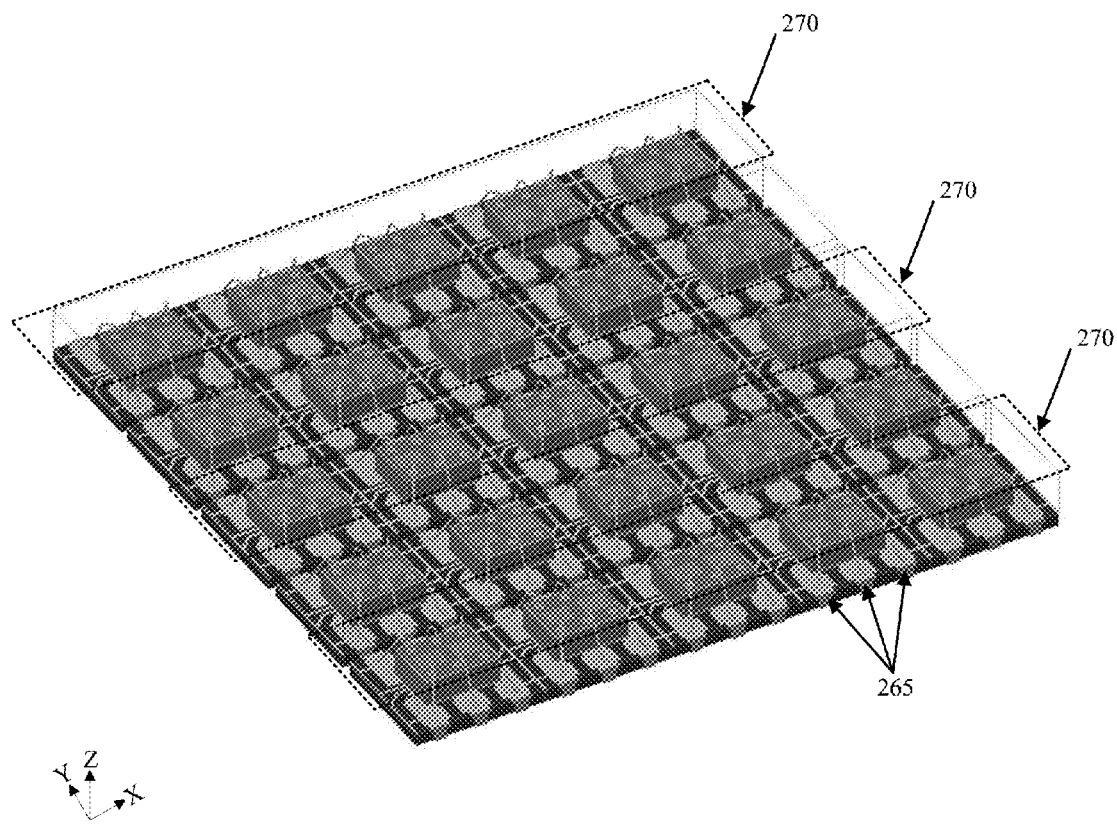
Figure 2D:
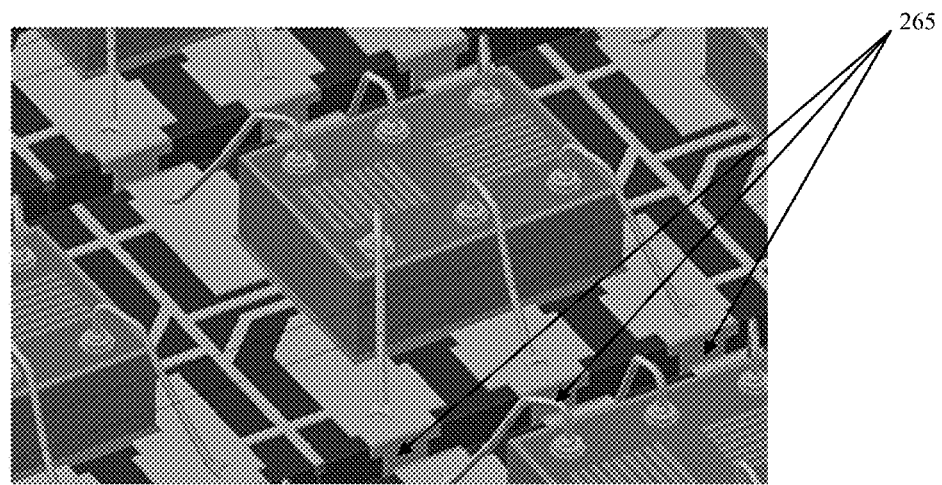
Figure 2E:
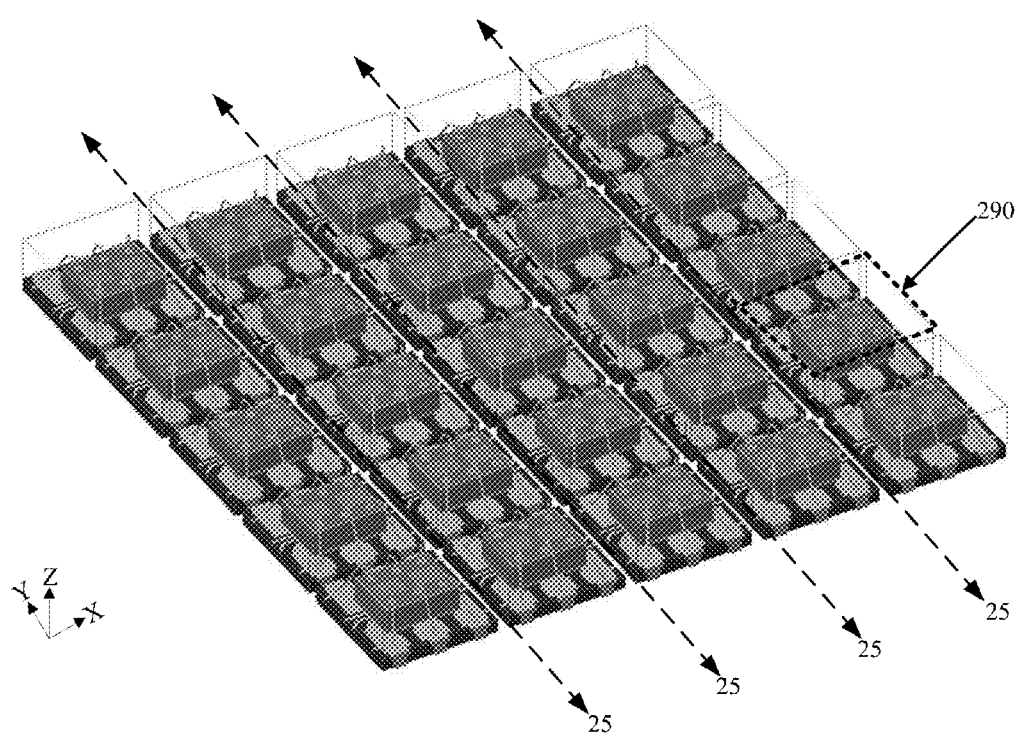
Figure 2F:
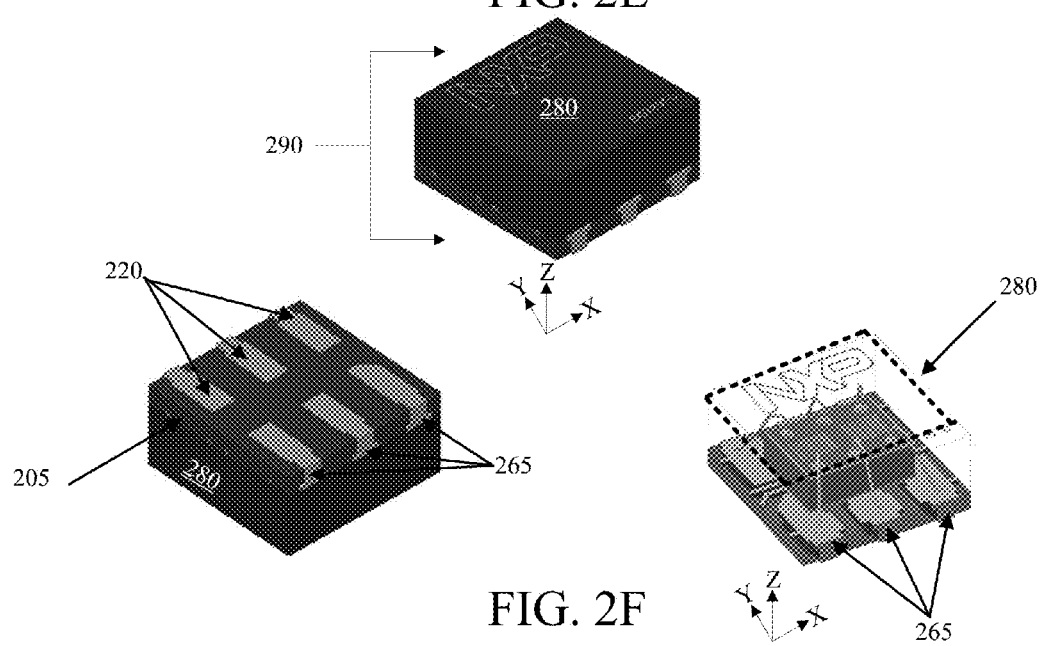

Refer to FIGS. 2A-2F. In FIG. 2A, a lead frame 200 having a substrate 205 has a plurality of device die positions 215 (arranged in a 5×5 array) for an individual package area 210. Six bond pads 220 provide connections to a device die and external leads. These bond pads 220 are electrically coupled to one another with connection traces 230; the bond pads 220 are essentially shorted together. Refer to FIG. 2B. A plurality of device die 240 are attached to the plurality of device die positions 215 defining an individual package area 210. The device die has bond pads 245 with wire bonds 250 connecting the device die 225 to the bond pads 220. The plurality of device die 240 of the array 200 is encapsulated in a molding compound 260. Refer to FIG. 2C. With a saw cut 15 in the X-direction, the sawing cuts through the molding compound 260 and perpendicularly through the surface of the bond pads 220 and exposing the corresponding vertical faces 225. These vertical faces 225 are un-plated copper (Cu). Refer to FIG. 2D. After the saw cut 15, there are five strips 270 of five devices 240. The connection traces 230 on the un-cut Y-direction connect these un-plated vertical faces 225 of the bond pads. An electroplating of tin (Sn) is performed and the connection traces 230 facilitate the plating of the vertical faces 265 of the leads 220 of the plurality of device die 240. Refer to FIG. 2E. A saw cut 25 in the Y-direction severs the connection traces 230 from the leads 220 of the device die 240 and results in individual assembled devices 290. Refer to FIG. 2F. In a series of views, an individual device 290 has leads 220 fully plated, the vertical faces 265 are plated, as well. The views show that connection traces 230 have been severed. The leads 220 connect only to corresponding device die pads of the packaged device die.

Figure 3:
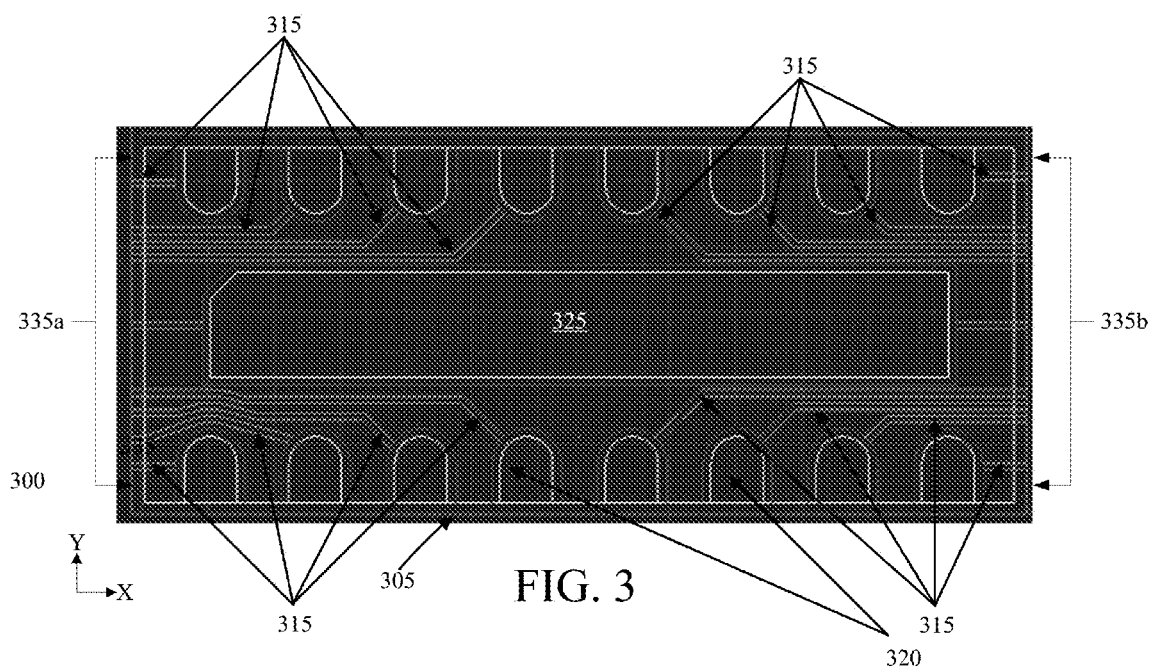
FIG. 3 is a DFN package with side solderable terminals configured according to an embodiment of the present disclosure.

Refer to FIG. 3. In an example embodiment according to the present disclosure, a DFN (Depopulated very-thin Flatpack No leads) package 300, built-up in a pre-molded substrate 305, is configured with connection traces so as to electrically couple the terminals of the package so that they may be electroplated during assembly. The package 300 has sixteen (16) pins 320 surrounding a die-attach area 325. Each of the sixteen pins 320, has a connection trace 315 connected thereto. The connection traces 315 are shorted together in the Y-direction at 335*a* and 335*b*. Though only a single unit 300 is shown, as discussed in connection with FIGS. 2A-2F, this DFN package 300 would be arranged in an array of multiple devices and processed in accordance with the present disclosure. The completed DFN package terminals on all of their surfaces will have been fully plated.

Figure 4:
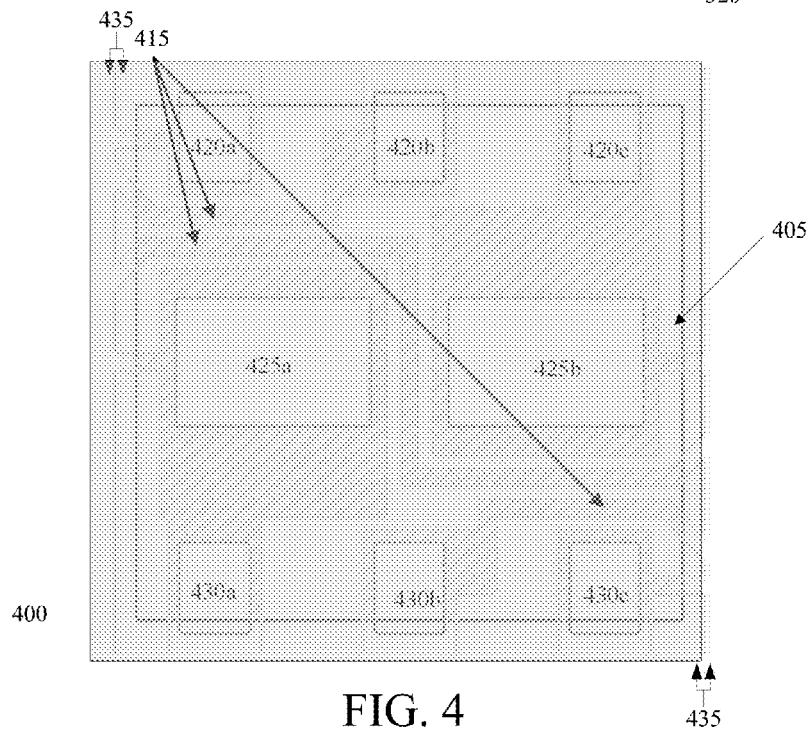
FIG. 4 is a SOT1118B Dual Die Pad DFN (ultra-thin-small-outline) package with side-solderable terminals configured according to an embodiment of the present disclosure.

Refer to FIG. 4. In an example embodiment according to the present disclosure, a SOT1118B dual-die pad side-solderable package 400, with two die-attach areas 425*a* and 425*b*, is also configured with connection traces so as to electrically couple the I/O terminals of the package so that they may be electroplated during assembly. As described earlier, the package lead frame is encapsulated into a molding compound and built-up. On the device-attach side, thin connection traces 415 are applied through photo-lithographic techniques. The connection traces are on the lead frame geometry at 435. The package 400 has two die attach areas 425*a* and 425*b* along with a first set of package terminals 420*a*, 420*b*, 420*c* and a second set of package terminals 430*a*, 430*b*, and 430*c*. Connection traces 415, 435 electrically couple the center package terminals 420*b* and 430*b*, which in turn, are coupled to the outer terminals 420*a*, 420*c*, 430*a*, and 430*c* in the Y-direction, as well as the X-direction.

Figure 5A:
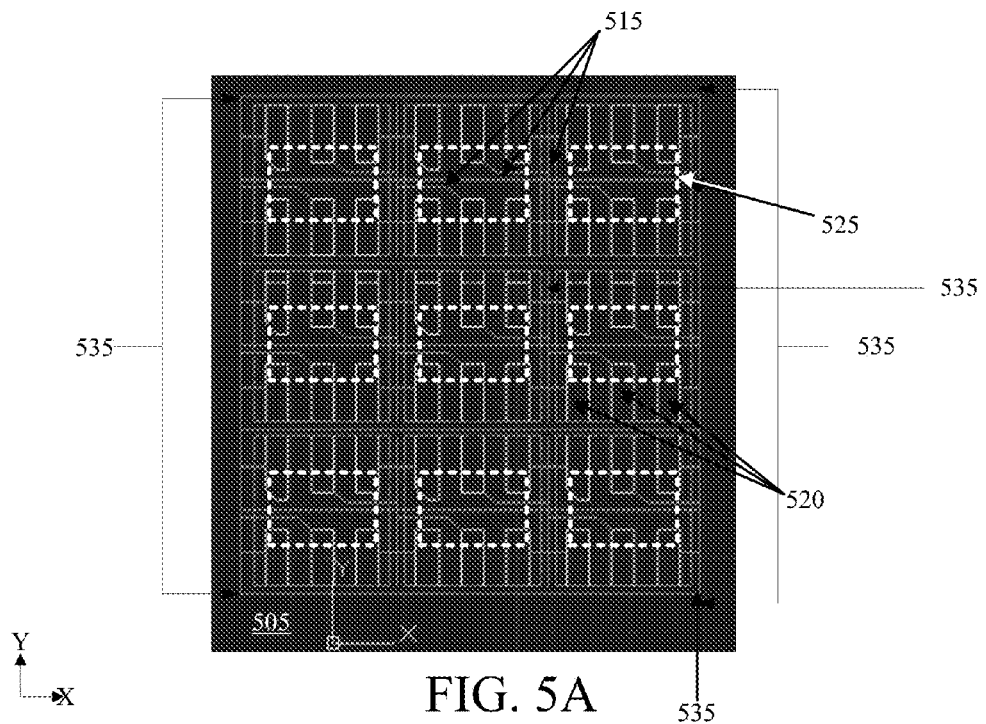
FIGS. 5A-5B are examples of a six-pin and eight-pin Chip-on-Lead (COL) package with side-solderable terminals configured according to an embodiment of the present disclosure.
Figure 5B:
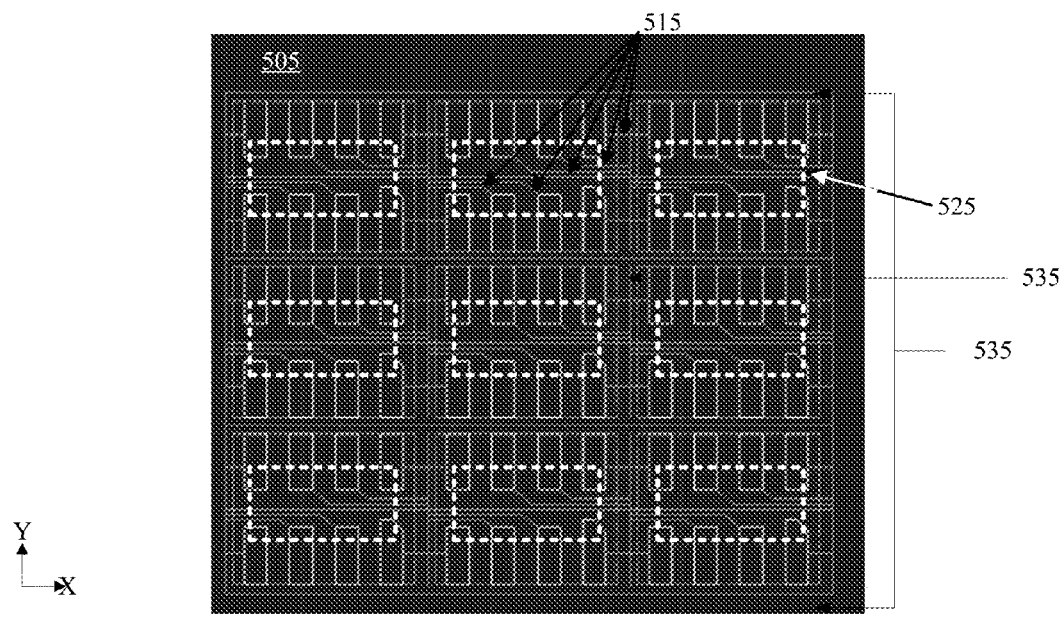

Refer to FIG. 5A. In an example embodiment, a chip-on-lead (COL) package is configured with connection traces. A six-pin device (with device positions 525) is arranged as a 3×3 array on a built-up substrate 505. Device pins 520 are electrically coupled by connection traces 515. These connection traces terminate at their endpoints on a common connection track 535. In the array, these common connections 535 may run in the Y-direction. Likewise, in FIG. 5B, a COL package is constructed similarly to that of FIG. 5A; however, an eight-pin device is arranged a 3×3 array. In production, these arrays may encompass hundreds or thousands of devices depending upon the size of the assembled device made available to the end user.

In the embodiments discussed, the lead frames of the various packages may or may not be pre-plated with a solderable surface. It is during the assembling of semiconductor devices according to the present disclosure, that some faces of the lead frame will be exposed (through sawing, laser cutting, etc), and therefore, un-plated whether the lead frame has undergone pre-plating before being pre-molded into a molding compound to make the built-up lead frame. Subsequently, these un-plated surfaces are plated when the disclosed process is completed.

Various exemplary embodiments are described in reference to specific illustrative examples. The illustrative examples are selected to assist a person of ordinary skill in the art to form a clear understanding of, and to practice the various embodiments. However, the scope of systems, structures and devices that may be constructed to have one or more of the embodiments, and the scope of methods that may be implemented according to one or more of the embodiments, are in no way confined to the specific illustrative examples that have been presented. On the contrary, as will be readily recognized by persons of ordinary skill in the relevant arts based on this description, many other configurations, arrangements, and methods according to the various embodiments may be implemented.

To the extent positional designations such as top, bottom, upper, lower have been used in describing this disclosure, it will be appreciated that those designations are given with reference to the corresponding drawings, and that if the orientation of the device changes during manufacturing or operation, other positional relationships may apply instead.

As described above, those positional relationships are described for clarity, not limitation.

The present disclosure has been described with respect to particular embodiments and with reference to certain drawings, but the invention is not limited thereto, but rather, is set forth only by the claims. The drawings described are only schematic and are non-limiting. In the drawings, for illustrative purposes, the size of various elements may be exaggerated and not drawn to a particular scale. It is intended that this disclosure encompasses inconsequential variations in the relevant tolerances and properties of components and modes of operation thereof. Imperfect practice of the invention is intended to be covered.

Where the term "comprising" is used in the present description and claims, it does not exclude other elements or steps. Where an indefinite or definite article is used when referring to a singular noun, e.g. "a" "an" or "the", this includes a plural of that noun unless something otherwise is specifically stated. Hence, the term "comprising" should not be interpreted as being restricted to the items listed thereafter; it does not exclude other elements or steps, and so the scope of the expression "a device comprising items A and B" should not be limited to devices consisting only of components A and B. This expression signifies that, with respect to the present disclosure, the only relevant components of the device are A and B.

Numerous other embodiments of the disclosure will be apparent to persons skilled in the art without departing from the spirit and scope of the disclosure as defined in the appended claims.

The invention claimed is:

1. A method for forming a semiconductor device in a leadless chip carrier (LCC) having a pre-plated and pre-molded lead frame assembly having an array of sub-assemblies each having a device die arranged thereon, the sub-assemblies having I/O terminals electrically connected to the device die, and the I/O terminals mutually connected to one another by connection traces, the method comprising:
   encapsulating, in a molding compound, the device die arranged on the array of sub-assemblies of the pre-plated and pre-molded lead frame assembly;
   in a first direction in a series of parallel cuts, cutting through the molding compound covering the I/O terminals, to a depth, exposing un-plated vertical surfaces of the I/O terminals;
   electroplating the I/O terminals to form plated vertical surfaces; and
   in a second direction in a series of parallel cuts, the second direction angled with respect to the first direction, the second series of cuts extending through the lead frame assembly and molding compound and severing the connection traces, to singulate an individual LCC device from the lead frame assembly.

2. The method as recited in claim 1, wherein the first direction is in the X-direction and wherein the second direction is in the Y-direction.

3. The method as recited in claim 2, wherein the connection traces electrically couple to one another at a common connection track in the Y-direction of the LCC pre-molded lead frame assembly.

4. The method as recited in claim 3, wherein the connection traces and the common connection track are co-planar with one another and a surface of the I/O terminals.

5. The method as recited in claim 4, wherein the device die is in contact with the surface of the I/O terminals.

6. A method for making a built-up lead frame whose I/O terminals can be electroplated on their vertical surfaces, the method comprises:
   selecting a lead frame assembly structure, the lead frame assembly structure having an having an array of sub-assemblies, each sub-assembly having a device position arranged thereon, the device die position having I/O terminals on first side and on an opposite second side;
   molding the lead frame assembly structure, thereby forming a built-up lead frame assembly structure, wherein the molding and lead frame assembly structure are coplanar with one another; and
   defining connection traces electrically coupling the I/O terminals of each die position to one another, the connection traces at endpoints converging onto a plurality of common connection tracks, the common connection tracks going in a Y-direction, wherein the defining connection traces is done with photo-lithographic techniques and the connection traces are printed on a surface shared by the device die position.

7. The method as recited in claim 6, wherein the connection traces at endpoints converge onto the plurality of common connection tracks whose direction is perpendicular to the direction of connection traces.

* * * * *